(12) United States Patent
Liu et al.

(10) Patent No.: US 7,767,509 B2
(45) Date of Patent: Aug. 3, 2010

(54) METHODS OF FORMING A MULTILAYER CAPPING FILM TO MINIMIZE DIFFERENTIAL HEATING IN ANNEAL PROCESSES

(75) Inventors: Mark Liu, Portland, OR (US); Rob James, Portland, OR (US); Jake Jensen, Beaverton, OR (US); Karson Knutson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 631 days.

(21) Appl. No.: 11/692,366

(22) Filed: Mar. 28, 2007

(65) Prior Publication Data

US 2008/0242038 A1    Oct. 2, 2008

(51) Int. Cl.
*H01L 21/336* (2006.01)

(52) U.S. Cl. .................. 438/197; 438/303; 438/551; 257/E21.409

(58) Field of Classification Search ............... 438/197, 438/303, 551; 257/E21.409
See application file for complete search history.

(56) References Cited

U.S. PATENT DOCUMENTS 6,221,767 B1 *   4/2001   Hsu et al. ................. 438/658

* cited by examiner

*Primary Examiner*—Jack Chen
(74) *Attorney, Agent, or Firm*—Kathy J. Ortiz

(57) ABSTRACT

Methods and associated structures of forming a microelectronic device are described. Those methods may include implanting the source/drain region, forming a multilayer cap on the source/drain region, annealing the source/drain region, and removing the multilayer cap.

7 Claims, 4 Drawing Sheets

METHODS OF FORMING A MULTILAYER CAPPING FILM TO MINIMIZE DIFFERENTIAL HEATING IN ANNEAL PROCESSES

BACK GROUND OF THE INVENTION

One concern with the process of forming a microelectronic device, such as a device utilizing transistors, for example, involves the step of annealing diffusion areas, such as during source/drain anneal processes, for example. The heating used to perform such an anneal can result in thermal non-uniformity across a particular substrate, such as a silicon wafer, for example. An upper boundary of an anneal process window can be determined by the point at which incident radiation begins to melt or ablate structures on the substrate or otherwise damage the substrate topography.

Structures located over isolation areas are typically the first to show signs of damage, in that the underlying dielectric layer may be ill-suited to dissipate heat. In some cases, when exposed to incident radiation, structures on isolation regions may be damaged, while adjacent structures disposed atop diffusion regions, such as diffused silicon regions, may remain intact.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
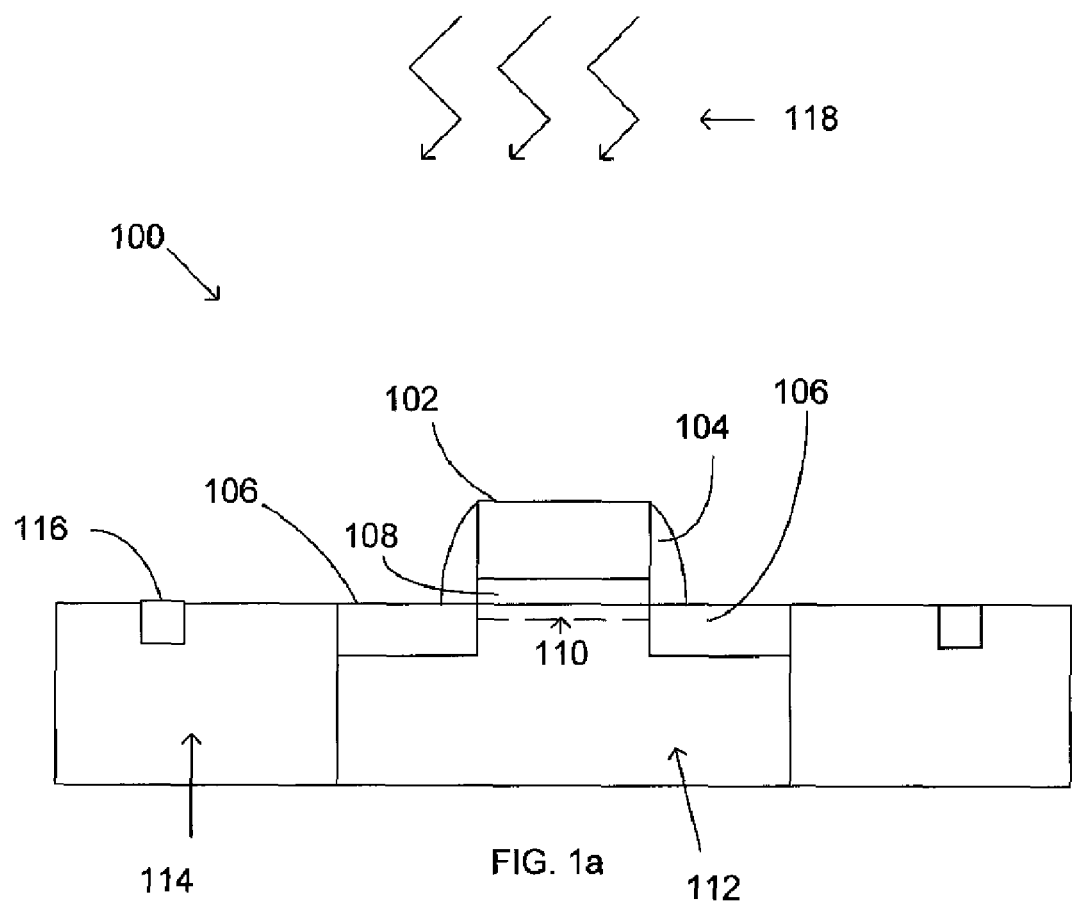
FIGS. 1*a*-1*f* represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include implanting the source/drain region, forming multiple thin films to comprise a multilayer cap on the source/drain region, annealing the source/drain region, and removing the multilayer cap. Methods of the present invention enable uniform heating during a melt anneal process. A multilayer cap is employed to tune the relative reflectance of structures on isolation versus structures on diffusion regions.

FIGS. 1*a*-1*f* illustrate an embodiment of a method of forming a microelectronic structure, such as a transistor structure, for example. FIG. 1*a* illustrates a cross-section of a portion of a transistor structure 100. The transistor structure 100 may be comprised of materials such as, but not limited to, silicon, silicon-on-insulator, germanium, indium antimonide, lead telluride, indium arsenide, indium phosphide, gallium arsenide, gallium antimonide, or combinations thereof.

In one embodiment, the transistor structure 100 may include a gate oxide region 108 and a gate 102. The transistor structure 100 may also comprise at least one spacer 104 and a channel region 110 located beneath the gate oxide 108 region 101. The transistor structure 100 may further comprise a source/drain region 106, which may be located adjacent at least one side of the gate region 102. The source/drain 106 regions may comprise silicon and/or silicon containing materials. The gate region 102 may be located in a silicon region 112. The transistor 100 structure 100 may comprise at least one structure on/in the silicon region 112, such as the gate region 102 and the source/drain 106, for example.

In one embodiment, the transistor structure 100 may further comprise at least one structure 116 located in an isolation region 114. In one embodiment, the at least one structure located on the isolation region 114 may comprise at least one of a shallow trench isolation and a metal structure. The isolation region 114 may comprise a dielectric material, such as but not limited to silicon dioxide, or other such materials, depending upon the particular application. In one embodiment, an implant process 118 may be performed on the transistor structure 100. In one embodiment, the source/drain region 106 and/or the gate region 102 may be implanted in order to form a silicide region 120 (FIG. 1*c*) within the source/drain region 106 and/or the gate region 102, for example.

Figure 1B:
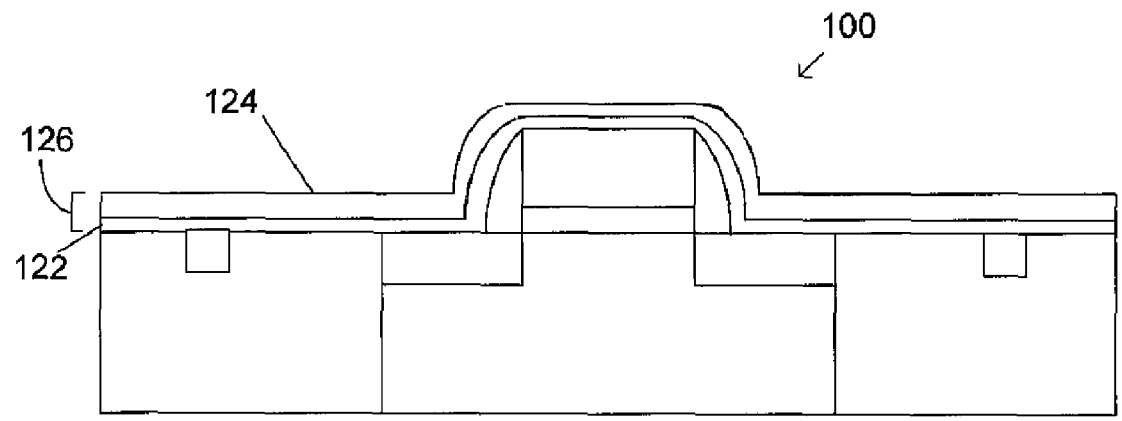

A multi-layer cap 126 may be formed on the transistor structure 100 (FIG. 1*b*). In one embodiment, the multi-layer cap 126 may comprise at least two layers. In one embodiment, the multi-layer cap 126 may be formed on the transistor structure 100 by utilizing a physical deposition technique, such as but not limited to a chemical vapor deposition (CVD), and atomic layer deposition (ALD), for example. In one embodiment, the materials and the number of layers of the multi-layer cap 126 may be optimized (i.e., tuned) to minimize a delta in absorbed and/or reflected radiation (that may be generated by a subsequent anneal process, for example) between the at least one structure disposed on the isolation region 116 and the at least one structure disposed on the silicon region 112.

In one embodiment, the multilayer cap 126 may comprise at least two layers. In one embodiment, the multilayer cap 126 comprises a first (closer to the source/drain region) layer that comprises an oxide layer, and a second layer that comprises a nitride layer, wherein the first layer may comprise a thickness of about 5 to about 90 nm, and the second layer may comprise a thickness of about 90 to about 200 nm. The exact thickness, materials and number of layers of the multilayer cap 126 may be chosen and optimized according to a particular application.

For example, in order to decrease a leakage of the transistor structure 100, the delta in absorbed and/or reflected radiation between the at least one structure disposed on the isolation region 116 and the at least one structure disposed on the silicon region 112 may be increased. In one embodiment, the reflectance of at least one structure disposed on an isolation region may be increased by about 20 percent to decrease the absorbed radiation in the structure, thereby reducing the anneal temperature and the leakage of the transistor structure. In another application, the delta may be reduced in order to optimize a process window for an anneal process, for example.

Figure 1C:
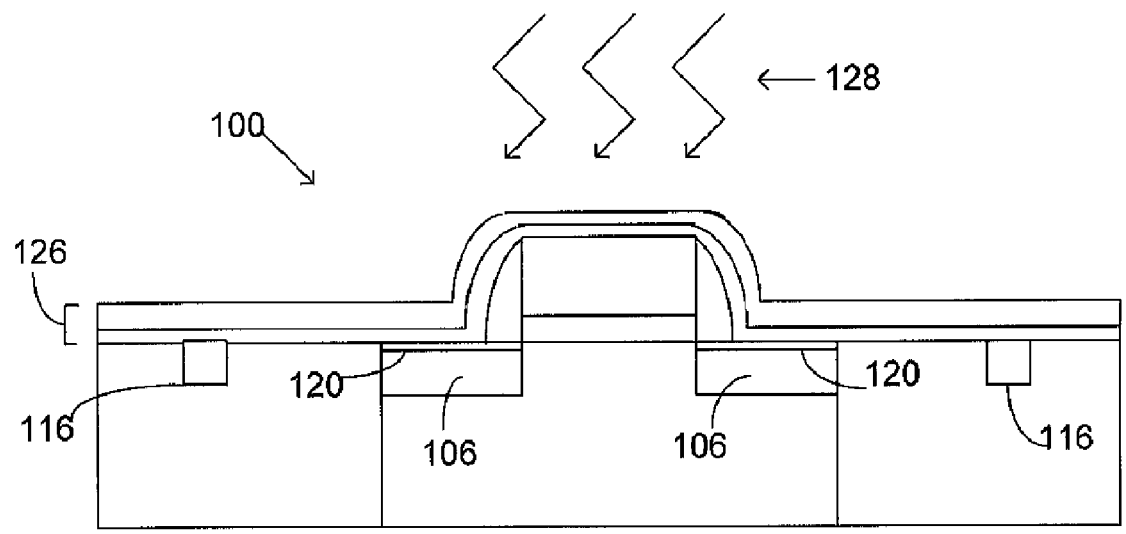
Figure 1D:
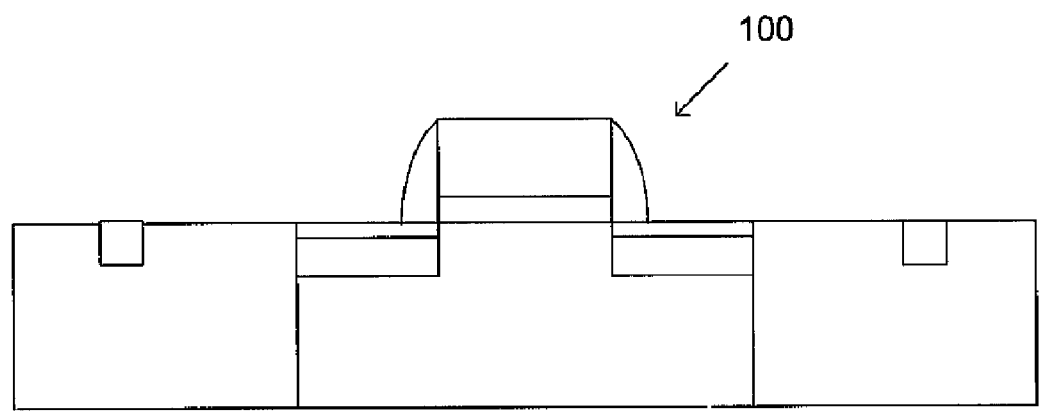

In one embodiment, an anneal process 128 may be performed on the transistor structure 100 (FIG. 1c). In one embodiment, the anneal process 118 may comprise a laser melt anneal, wherein a laser may be pulsed to heat the transistor structure 100, in other embodiments, any suitable radiant heat source may be employed to generate radiant energy to heat the transistor structure 100. In one embodiment, the radiant energy from the laser may form a silicide region 120 within the source/drain region 106. The number of layers and thicknesses of the multilayer cap 126 may be optimized in order to prevent melting of structures disposed over the isolation region (FIG. 1g, Prior Art) while the source/drain region (and/or any structures disposed in silicon areas) is annealed.

Figure 1E:
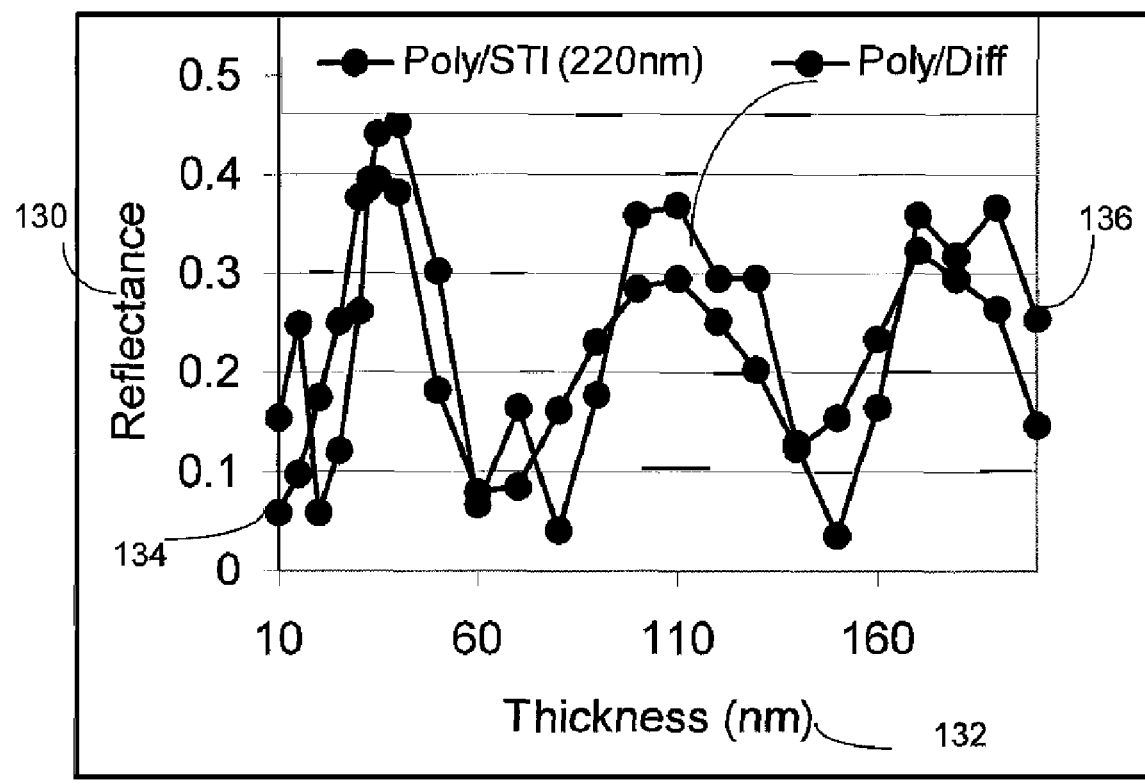

FIG. 1e depicts a graph of reflectance 130 vs. nitride thickness 132, wherein the first layer of the multilayer cap 126 comprises an oxide thickness of about 5 nm, and the second layer of the multilayer cap comprises the nitride thickness 132, which is varied according to the graph. The thicknesses of the two layer multilayer cap 126 can be optimized to increase or decrease the absorbed and/or reflected radiation delta between structures (ex, shallow trench isolation structures) disposed in isolation regions and structures (ex, silicon diffusion regions) disposed in silicon regions.

Figure 1F:
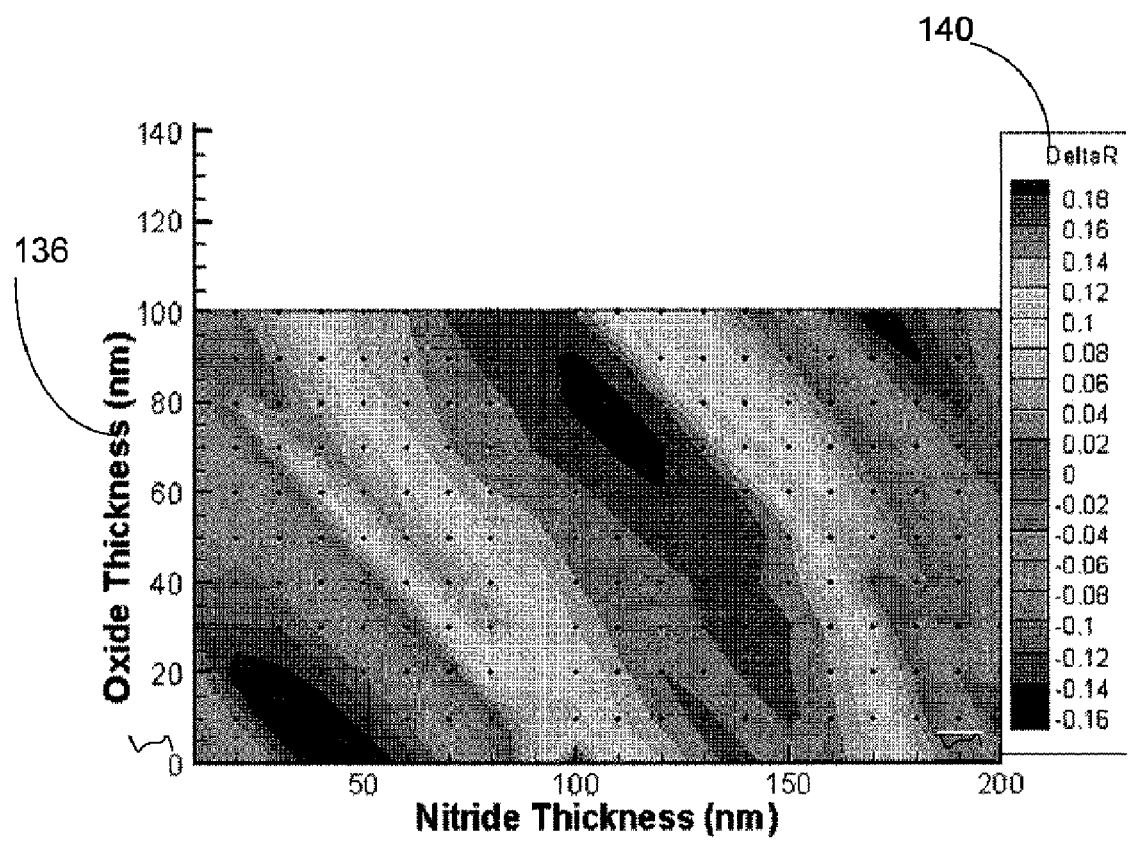
Figure 1G:
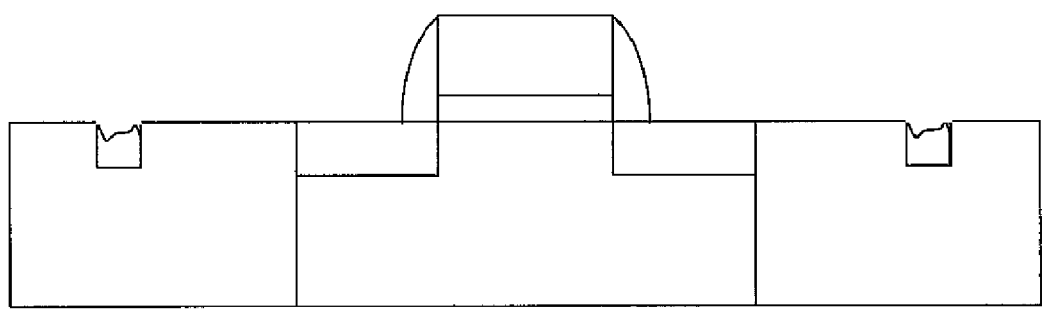
FIG. 1*g* represents structures from the Prior Art.

FIG. 1f depicts a graph wherein an oxide thickness 136 is varied and a nitride thickness 138 is varied for a two layer multilayer cap, to determine a particular delta 140. Thus, multiple layers of the multilayer cap can be optimized for a particular radiation delta between structures on isolation and structures on silicon, depending upon the particular application. After the anneal process 128 has been performed, the multilayer cap may be removed (FIG. 1d).

Thus, the embodiments of the present invention enable the formation of a multilayer cap to engineer reflectance optimization during anneal processes, in order to address the differential heating of structures on isolation materials versus structures on silicon. Structures located over isolation areas are typically the first to show signs of damage, in that the underlying isolation material may be ill-suited to dissipate heat. At incident powers where structures-on-isolation are damaged adjacent structures atop diffusion (Si) regions remain intact. This invention provides a means to minimize differential heating with a capping layer which selectively reflects incident radiation in the structures-on-isolation.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising:
   implanting a source/drain region of a transistor structure disposed on a wafer, wherein the wafer comprises at least one structure disposed on an isolation region and at least one structure disposed on a silicon region; and
   forming a multilayer cap on the source/drain region, wherein the material selection and number of material layers of the multilayer cap is optimized to tune a delta in at least one of a reflected and an absorbed radiation between the structures located on isolation region and the structures located on silicon.

2. The method of claim 1 further comprising pulsing a laser to melt anneal the source/drain region.

3. The method of claim 2 further comprising wherein the at least one structure on the isolation region is not melted, and the source/drain region forms a silicide region.

4. The method of claim 1 wherein the delta is increased to decrease the leakage of the transistor structure.

5. The method of claim 1 further comprising wherein the multilayer cap comprises a first layer and a second layer.

6. The method of claim 5 wherein the first layer comprises an oxide layer.

7. The method of claim 5 wherein the second layer comprises a nitride layer.

* * * * *